United States Patent [19]

Sato et al.

[11] Patent Number: 4,946,801

[45] Date of Patent: Aug. 7, 1990

[54] EPITAXIAL WAFER

[75] Inventors: Tadashige Sato; Yasuji Kobashi, both of Tsuchiura, Japan

[73] Assignees: Mitsubishi Monsanto Chemical Co., Ltd.; Mitsubishi Kasei Corporation, both of Tokyo, Japan

[21] Appl. No.: 270,275

[22] Filed: Nov. 14, 1988

[30] Foreign Application Priority Data

Nov. 13, 1987 [JP] Japan ................................ 62-287054

[51] Int. Cl.⁵ ............................................. H01L 33/00
[52] U.S. Cl. .................................. 437/126; 437/128; 437/130; 437/133; 357/17
[58] Field of Search ................... 437/184, 5, 127, 126, 437/119, 128, 130; 357/17; 148/DIG. 77, DIG. 99

[56] References Cited

U.S. PATENT DOCUMENTS

| 3,965,347 | 6/1976 | Heywang | 357/17 |
| 4,296,425 | 10/1981 | Nishizawa | 357/17 |
| 4,354,140 | 10/1982 | Nishizawa | 357/17 |
| 4,354,199 | 10/1982 | Hasegawa et al. | 357/16 |
| 4,414,558 | 11/1983 | Nishizawa et al. | 357/17 |
| 4,507,157 | 3/1985 | Oliver, Jr. | 437/119 |

Primary Examiner—Brian E. Hearn
Assistant Examiner—Tuan Nguyen
Attorney, Agent, or Firm—Burgess, Ryan and Wayne

[57] ABSTRACT

In an epitaxial wafer comprising of a single crystalline substrate, a p type gallium aluminum arsenide mixed crystalline layer and n type gallium aluminum arsenide mixed crystalline layer having an indirect transition type band structure. The p type gallium aluminum arsenide mixed crystalline layer consists of a gallium aluminum arsenide mixed crystalline layer having a direct transition type band structure, positioned about 3 to 10 μm from the pn junction and a gallium aluminum arsenide mixed crystalline layer having an indirect transition type band structure. The aluminum arsenide mixed crystal ratio in the gallium aluminum arsenide is exponentially and gradually changed in the region between the direct transition type layer and the indirect transition type layer.

9 Claims, 1 Drawing Sheet

EPITAXIAL WAFER

BACKGROUND OF THE INVENTION

1. Field of the Invention

The present invention relates to an epitaxial wafer, and more particularly, to a gallium aluminum arsenide (GaAlAs) mixed crystalline epitaxial wafer suitable for the production of a high luminance light emitting diode (LED).

2. Description of the Related Art

Since LED's can be driven by a low voltage and have a long life, they are widely used as light emitting indicators; in particularly, they are now used as outdoor light emitting indicators such as a destination indicating plate or a traffic signal, among others. Such devices require an LED, to provide large light output power to ensure that they can function as indicators as required even under sunny conditions.

An example of an LED having a large output power, is that produced by using, for example, a GaAlAs mixed crystalline epitaxial wafer, and this kind of LED using a GaAlAs mixed crystal is divided into a single hetero type epitaxial wafer and a double hetero type epitaxial wafer as is well known.

The single hetero type epitaxial wafer is produced by the steps of forming an n-type GaAlAs mixed crystalline layer having an indirect transition type band structure or a single crystalline substrate and forming a p type GaAlAs mixed crystalline layer having a direct transition type band structure on the n type GaAlAs mixed layer.

As shown in FIG. 1, in the single hetero type epitaxial wafer, a rapid change of the AlAs mixed crystal ratio (hereinafter explained in detail) occurs at depth A, i.e., at a pn junction portion of the wafer.

The double hetero type epitaxial wafer is formed of a GaAlAs mixed layer having n type and p type indirect transition type GaAlAs mixed layers on a single crystalline substrate and an active layer consisting of a direct transition type p type GaAlAs mixed crystalline layer having a thickness of about 0.5 to 5 $\mu$m formed therebetween.

As shown in FIG. 2, a steep change of the AlAs mixed crystal ratio occurs at depths B and C, i.e., at the hetero junction The region B to C denotes the direct transition type GaAlAs mixed crystalline layer. This rapid change of the mixed crystal ratio is used to increase the efficiency of carrier injection and carrier recombination. The single hetero epitaxial wafer can be easily produced, as it can be formed merely by growing two kinds of mixed crystalline layers as explained above, and the thickness of each mixed crystalline layer can be roughly controlled, but LED's fabricated from the single hetero epitaxial wafer have low light output power. On the other hand, although LED's fabricated from the double hetero type epitaxial wafer have high output power, three kind of GaAlAs mixed crystalline layer must be formed thereon: Particularly, the thickness of the p type active layer between the n and p type indirect transition type GaAlAs mixed crystalline layers must be precisely controlled, and thus the growth processes for the double hetero type epitaxial wafer is very complicated.

SUMMARY OF THE INVENTION

Therefore, an object of the present invention is to provide an epitaxial wafer which is suitable for the production of an LED having high output power i.e., luminance.

Another object of the present invention is to provide an epitaxial wafer which can be easily produced.

Thus, according to the present invention, there is provided an epitaxial wafer comprising of a single crystalline substrate (1), a p type gallium aluminum arsenide mixed crystalline layer (2) and an n type gallium aluminum arsenide mixed crystalline layer (6) having an indirect transition type band structure, wherein said p type gallium aluminum arsenide mixed crystalline layer (2) consists of a gallium aluminum arsenide mixed crystalline layer having a direct transition type band structure, positioned about 3 to 10 $\mu$m from the pn junction (5) and a gallium aluminum arsenide mixed crystalline layer (3) having an indirect transition type band structure, the aluminum arsenide mixed crystal ratio in the gallium aluminum arsenide being exponentially and/or gradually changed in the region between the layer (4) to the layer (3).

DESCRIPTION OF THE PREFERRED EMBODIMENTS

The embodiments of the present invention will now be explained with reference to the drawings.

Figure 3:
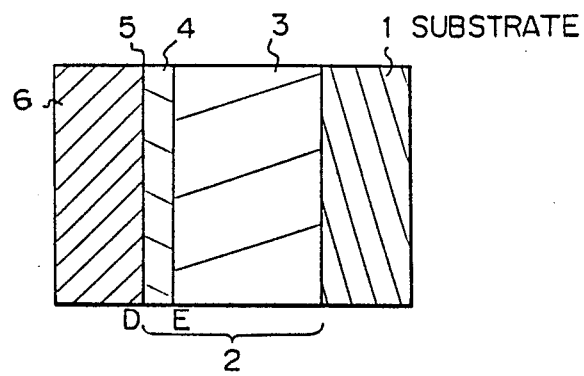
FIG. 3 is a cross-sectional view of an epitaxial wafer according to the present invention.

FIG. 3 shows a cross-sectional view of an epitaxial wafer according to the present invention.

As shown in FIG. 3, a layer 3 of a GaAlAs mixed crystal having an indirect transition type band structure, a layer 4 of a GaAlAs mixed crystal having a direct transition type band structure, and a layer 6 of an n type GaAlAs mixed crystal having an indirect transition type band structure are formed on a single crystalline substrate 1. The layer 2 is a p type GaAlAs mixed crystalline layer formed by the layers 3 and 4, and a pn junction 5 is formed between the layers 4 and 6.

The GaAlAs mixed crystal has a direct transition type of $0 < X \leq$ about 0.45, where x is the AlAs mixed crystal ratio, and an indirect transition type band structure of about $0.45 < X < 1$. The AlAs mixed crystal ratio x is expressed as $Ga_{1-x}Al_xAs$, i.e., $(AlAs) x (GaAs)_{1-x}$. In this expression x is within $0 < X < 1$.

The single crystalline substrate is preferably gallium arsenide (GaAs), and further, gallium phosphide (GaP), indium phosphide (InP), silicon (Si), and germanium (Ge), for example, which have a lattice constant similar to that of GaAlAs, can be used as the substrate 1.

The orientation of the surface of the substrate 1 is usually {100}, as an improved crystalline epitaxial layer can be obtained thereby and the carrier concentration of the substrate 1 is preferably $1 \times 10^{17} cm^{-3}$ or more, to reduce internal resistance and obtain an improved ohmic electrode. The conductive type of the substrate 1 is not especially limited, but preferably, a zinc-doped p type GaAs is used.

The layer 3 acts as a barrier which confines carriers in the layer 4. The AlAs mixed crystal ratio of the region 3 is about $0.4 < X < 1$, preferably, $0.5 \leq X \leq 0.8$, and the thickness of the layer 3 is preferably about 15 to about 50 μm, to avoid absorption of light generated in the layer 4 and confine the carriers therein, and thus enhance the luminosity thereof.

Light is generated from the layer 4, which has the same AlAs mixed crystal ratio as the above-mentioned direct transition type crystal.

Figure 1:
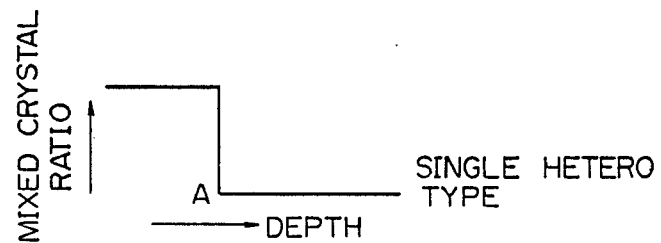
FIG. 1 is a graph illustrating the mixed crystal ratio of a single hetero type conventional epitaxial wafer.
Figure 2:
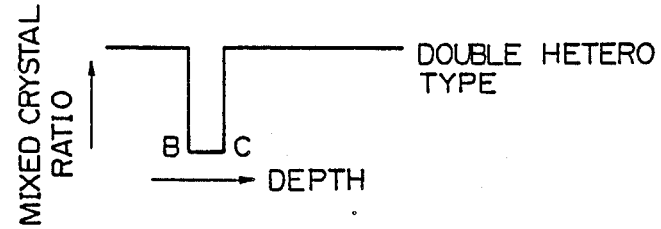
FIG. 2 is a graph illustrating the mixed crystal ratio of a double hetero type conventional epitaxial wafer.
Figure 4:
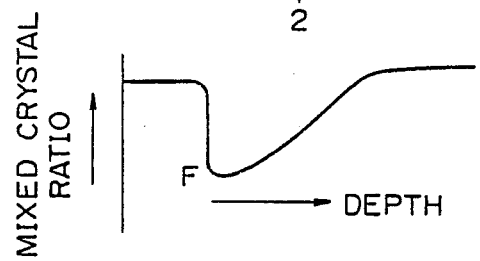
FIG. 4 is a graph illustrating the mixed crystal ratio of an epitaxial wafer according to the present invention.

Particularly, when a red light is generated the AlAs mixed crystal ratio is within $0.3 \leq X \leq 0.4$, and the thickness of the layer 4 must be about 3 to 10 μm, preferably 4 to 8 μm. If the thickness is less 3 μm, the light emitting reconnection is not sufficiently generated. Conversely, when the thickness is more than 10 μm, the light absorption into the layer 4 is increased and the light emission efficiency is lowered Preferably, layer 2 has a total thickness of about 15 to 50 μm, since this enables AlAs mixed crystal ratio to be exponentially and/or gradually changed at the region between the layer 4 and the layer 3 as shown in FIG. 4, and such an exponential and gradual change of the AlAs mixed crystal ratio is required essential to the simplification of the production process. Note the depth F in FIG. 4 corresponds to the depth D in FIG. 3. If the change of the AlAs mixed crystal ratio becomes discontinuous or rapid, as shown in FIGS. 1 and 2, the production process becomes unpreferably complicated.

The n type GaAlAs mixed crystal layer 6 having an indirect transition type band structure is preferable as it decreases the internal absorption of generated light. The n type GaAlAs mixed crystal layer 6 has an AlAs mixed crystal ratio x of about $0.45 < X < 1$, preferably $0.5 \leq X \leq 0.8$, and preferably a thickness of 20 to 100 μm.

In the above-mentioned embodiment, a p type substrate is uses as the single crystalline substrate 1, but when an n type substrate is used as the single crystalline substrate 1 the n type GaAlAs mixed crystal layer 6 is formed on the substrate, and subsequently, the layer 4 is formed on the layer 6, and thus the formation of a pn junction at an interface between the substrate and the GaAlAs mixed crystalline layer is avoided.

The epitaxial wafer is preferably produced by a liquid phase epitaxial growth (hereinafter referred to as LPE), as this enables an easy growth of a GaAlAs mixed crystal layer having a large thickness. When the LPE process is used, the epitaxial wafer of the present invention can be produced merely by using two kinds of molten liquid corresponding to the layers 2 and 6, under suitable condition, and to ensure a gradual and/or exponential change in the AlAs mixed crystal ratio between the layers 3 and 4, as shown in FIG. 4, a melt composition having a comparatively low concentration of AlAs, preferably an AlAs mixed crystal ratio x of $0.45 < X \leq 0.65$, is used for the growth of a GaAlAs mixed crystal.

Further, the cooling rate is preferably high; for example, when the cooling rate is about 1° C./min or more a change with respect to the thickness of the AlAs mixed crystal can be enhanced, with the result that the luminosity is improved.

Although Zn is preferably used as the p type dopant in the present invention, mercury (Hg) and cadmium (Cd) and the like also can be used, and further, although an n type dopant tellurium (Te) is preferably used, sulfur (S) and silicon (Si) also can be used.

The remaining LPE growth conditions may be the same as those used in a usual LPE process. The epitaxial wafer according to the present invention will be described in detail by way of the following Example and a Comparative Example of a conventional epitaxial wafer. A sliding type LPE apparatus provided with at least two melt tanks was used in both the Example and the Comparative Example.

EXAMPLE

The single crystalline substrate used in this Example was a Zn doped p type GaAs single crystalline wafer having a carrier concentration of $1.2 \times 10^{19}$ cm$^{-3}$ and a diameter of 5 cm. The substrate had a {100}surface orientation.

As the melt for growing an epitaxial layer corresponding to the p type layer 2, a melt wherein 3.2 g of polycrystalline GaAs of, 0.9 g of metal Al and 0.008 g of Te were melted into 50 g of metal Ga was used.

Further as the melt for growing an epitaxial layer corresponding to the n type layer 6, a melt wherein 1.1 g of crystalline GaAs 0.9 g of metal Al and 0.008 g of Te were melted into 50 g of metal Ga was used.

The substrate and each melt were set at a desired position in an LPE apparatus and were heated at a temperature of 900° C., under a flow of hydrogen, for about one hour. Then a melt for growing a p type layer was set on the substrate by operating a slide of the LPE apparatus, and after cooling to 860° C. at a cooling rate of 4° C./min, a p type layer was grown. Subsequently a melt for growing an n type layer was set on the substrate on which the p type layer had been grown, and after cooling to 800° C. at a cooling rate of 1.0° C./min, an n type layer was grown on the p type layer.

The thickness of the n type layer was 40 μm and the AlAs mixed crystal ratio x was a constant 0.7.

Then, square chips each size of which were 500 μm length were produced from the obtained epitaxial wafer. A measured light output power of 6.2 mcd was obtained as an average value of 1000 chips under the conditions of a current density of 8 A/cm$^2$ and without the application of an epoxy resin coating.

The thickness of the p type layer was 20 μm, and the AlAs mixed crystal ratio x was 0.6 at the interface between the p type layer and the substrate and 0.35 near the pn junction portion. Namely, the AlAs mixed crystal ratio x was continuously decreased over the distance from the substrate to the pn junction. The thickness of the layer having a direct transition type band structure, which corresponds to the layer 4 in FIG. 3, was 4 μm when measured from the surface of the substrate to the pn junction.

In this example, the light emitting peak wavelength was 655 nm.

COMPARATIVE EXAMPLE

The same substrate as used in the above-mentioned example was used in this comparative example.

As the melt for growing a p type layer, a melt wherein 4.2 g of polycrystalline GaAs, 0.41 g of metal Al and 0.1 g of metal Zn were melted into 50 g of metal Ga was used.

As the melt for growing an n type layer, a melt having the same composition as used in the above-mentioned Example was used.

Epitaxial layers were grown in the same way as in the Example except that the cooling rate for both the n type layer and p type layer was 0.5° C./min.

The thickness of the p type layer was 25 μm, and the AlAs mixed crystal ratio x was 0.4 at the interface between the p type layer and the substrate, and 0.35 near the pn junction portion. The p type and n type layer were direct transition single hetero type epitaxial wafers.

The thickness of the n type layer was 40 μm, and the AlAs mixed crystal ratio x was a constant 0.7.

Then square chips each size of which were 500 μm were produced from the obtained epitaxial wafer. A measured light output power of 3.5 mcd was obtained as an average value of 1000 chips under the same conditions as used in the Example.

In this comparative example, the light emitting peak wavelength was 653 nm. As apparent from the results of the Example and the Comparative Example, the LED produced by using an epitaxial wafer according to the present invention has a large light output power compared to the LED produced by using an epitaxial wafer having a conventional single hetero type structure.

We claim:

1. An epitaxial wafer comprising of a single crystalline substrate (1), a p type gallium aluminum arsenide mixed crystalline layer (2) and an n type gallium aluminum arsenide mixed crystalline layer (6) having an indirect transition type band structure, wherein said p type gallium aluminum arsenide mixed crystalline layer (2) consists of a gallium aluminum arsenide mixed crystalline layer (4) having a direct transition type band structure, extending from the pn junction (5) and a gallium aluminum arsenide mixed crystalline layer (3) having an indirect transition type band structure, and the aluminum arsenide mixed crystal ratio in the gallium aluminum arsenide being exponentially and gradually changed in the region between the pn junction (5) and/or the substrate (1).

2. An epitaxial wafer according to claim 1, wherein the thickness of the p type gallium aluminum arsenide mixed crystalline layer (2) is about 15 to 50 μm.

3. An epitaxial wafer according to claim 1, wherein the aluminum arsenide mixed crystal average ratio x in the p type layer (2) is $0.45 < x \leq 0.65$.

4. An epitaxial wafer according to claim 1, wherein the thickness of the n type layer (6) is 20 to 100 μm.

5. An epitaxial wafer according to claim 1, wherein the aluminum arsenide mixed crystal ratio x of the n type layer (6) is $0.5 \leq x \leq 0.8$.

6. An epitaxial wafer according to claim 1, wherein the aluminum arsenide mixed crystal ratio x in the layer (3) is $0.5 \leq x \leq 0.8$.

7. An epitaxial wafer according to claim 1, wherein the thickness of the layer (4) is about 3 to 10 μm.

8. An epitaxial wafer according to claim 1, wherein the single crystalline substrate is one of GaAs, GaP, InP, Si and Ge.

9. An epitaxial wafer according to claim 8, wherein the single crystalline substrate has a surface orientation of {100}.

* * * * *